United States Patent
Bisig

(10) Patent No.: US 10,346,264 B2
(45) Date of Patent: Jul. 9, 2019

(54) FREQUENCY CONVERTER

(71) Applicant: Schmidhauser AG, Romanshorn (CH)

(72) Inventor: Thomas Bisig, Romanshorn (CH)

(73) Assignee: Schmidhauser AG, Romanshorn (CH)

( * ) Notice: Subject to any disclaimer, the term of this patent is extended or adjusted under 35 U.S.C. 154(b) by 0 days.

(21) Appl. No.: 15/542,195

(22) PCT Filed: Dec. 17, 2015

(86) PCT No.: PCT/EP2015/080365
§ 371 (c)(1),
(2) Date: Jul. 7, 2017

(87) PCT Pub. No.: WO2016/110393
PCT Pub. Date: Jul. 14, 2016

(65) Prior Publication Data
US 2017/0357556 A1    Dec. 14, 2017

(30) Foreign Application Priority Data

Jan. 9, 2015   (DE) .......................... 10 2015 200 190

(51) Int. Cl.
*H04L 12/54*   (2013.01)
*G06F 1/08*    (2006.01)
(Continued)

(52) U.S. Cl.
CPC ............ *G06F 11/1604* (2013.01); *G06F 1/08* (2013.01); *H02M 5/45* (2013.01); *H02M 5/4585* (2013.01);
(Continued)

(58) Field of Classification Search
CPC ...... H02M 5/45; H02M 5/4505; H02M 5/451; H02M 5/452; H02M 5/458; H02M 5/4585;
(Continued)

(56) References Cited

U.S. PATENT DOCUMENTS 6,058,036 A    5/2000  Endo et al.
6,157,093 A   12/2000  Giannopoulos et al.
(Continued)

FOREIGN PATENT DOCUMENTS

DE    197 57 688 A1    7/1998
DE    199 27 126 A1    1/2001
(Continued)

OTHER PUBLICATIONS

International Search Report (PCT/ISA/210) issued in PCT Application No. PCT/EP2015/080365 dated Jun. 1, 2016 with English-language translation (four (4) pages).
German-language Written Opinion (PCT/ISA/237) issued in PCT Application No. PCT/EP2015/080365 dated Jun. 1, 2016 (five (5) pages).

*Primary Examiner* — Young T Tse
(74) *Attorney, Agent, or Firm* — Crowell & Moring LLP

(57) ABSTRACT

A frequency converter control unit has: a serial control unit interface, a control unit clock pulse generator for generating a control unit clock pulse, and a control unit processor which is designed to define a control parameter depending on an actual value. A power unit has a data connection to the control unit and has several power semiconductors, a power unit clock pulse generator for generating an adjustable power unit clock pulse, a serial power unit interface, a clock pulse generator adjustment unit which has a signal connection to the power unit interface and which adjusts the power unit clock pulse depending on signals received by the power unit on the power unit interface, a power unit processor which controls the power semiconductors depending on the control parameter and the power unit clock pulse, and a sensor unit that determines the actual value. The control unit transmits the control parameter via the control unit interface to the power unit. The power unit transmits the actual value via the power unit interface to the control unit.

16 Claims, 1 Drawing Sheet

(51) Int. Cl.
*H02M 5/45* (2006.01)
*H03K 5/19* (2006.01)
*H03L 7/18* (2006.01)
*G06F 11/16* (2006.01)
*H02M 5/458* (2006.01)
*H04L 12/70* (2013.01)

(52) U.S. Cl.
CPC .............. *H03K 5/19* (2013.01); *H03L 7/1803* (2013.01); *H04L 12/56* (2013.01); *H04L 2012/5674* (2013.01)

(58) Field of Classification Search
CPC ........... H03K 5/19; H03L 7/00; H03L 7/1803; H04B 3/50; H04B 3/54; H04L 7/00; H04L 7/06; H04L 12/56; H04L 2012/5674; G06F 1/08; G06F 11/1604
USPC ....... 375/219, 220, 222, 257, 354, 356, 362, 375/364, 369
See application file for complete search history.

(56) References Cited

U.S. PATENT DOCUMENTS

| | | | |
|---|---|---|---|
| 8,310,830 B2 | 11/2012 | Zheng et al. | |
| 8,918,668 B2 | 12/2014 | Iwahashi et al. | |
| 2009/0171178 A1* | 7/2009 | He | A61B 5/0031 600/365 |
| 2011/0317749 A1* | 12/2011 | Schedelbeck | H04L 5/1438 375/219 |
| 2012/0068608 A1* | 3/2012 | Covaro | G01J 1/18 315/151 |
| 2014/0097886 A1 | 4/2014 | Shepard et al. | |
| 2015/0008756 A1* | 1/2015 | Lee | H02J 17/00 307/104 |

FOREIGN PATENT DOCUMENTS

| | | |
|---|---|---|
| DE | 10 2009 055 126 A1 | 6/2011 |
| EP | 2 089 962 B1 | 1/2011 |
| EP | 2 477 007 A1 | 7/2012 |

* cited by examiner

FREQUENCY CONVERTER

BACKGROUND OF THE INVENTION

The invention relates to a frequency converter.

The object of the invention is to provide a frequency converter which is simple to manufacture and which has a high reliability in operation.

SUMMARY OF THE INVENTION

The invention achieves this object by means of a frequency converter according to embodiments of the invention.

The frequency converter has a control unit.

The control unit has a serial control unit interface.

The control unit furthermore has a control unit clock pulse generator, for example in the form of a (quartz) oscillator, for generating a control unit clock pulse. Data are transmitted via the serial control unit interface in terms of their timing depending on the control unit clock pulse. For example, a bit rate of the data may be dependent on the control unit clock pulse.

The control unit furthermore has a control unit processor which is designed to define at least one control parameter depending on at least one actual value. The control unit processor can be clocked by means of the control unit clock pulse.

The frequency converter furthermore has a power unit which may be physically separated from the control unit and which has a data connection to the control unit.

The power unit conventionally has a number of power semiconductors which serve to generate high-frequency, for example pulse-width-modulated, control signals or control voltages for an electric motor. The power semiconductors may, for example, be controlled in such a way that a required motor torque, a required motor speed, a required motor current, etc., can be set. Reference is also made in this respect to the relevant technical literature.

The power unit furthermore has a power unit clock pulse generator for generating an adjustable power unit clock pulse. The power unit clock pulse generator may, for example, be a DCO (Digitally Controlled Oscillator).

The power unit furthermore has a serial power unit interface which is connectable to the control unit interface or is connected to it when the frequency converter is in operation.

The control unit and power unit may, for example, be disposed in housings that are separated from one another, wherein the control unit is connectable to the power unit, wherein a detachable, mechanically engaging connection can be provided between the control unit and the power unit. In the connected state, the control unit interface and the power unit interface can be electrically interconnected so that data are bidirectionally exchangeable between the control unit and the power unit via their respective interfaces.

The power unit furthermore has a clock pulse generator adjustment unit which is connected directly or indirectly to the power unit interface or has a signal connection or operative connection to the power unit interface. The clock pulse generator adjustment unit is designed to adjust the power unit clock pulse depending on signals and/or data and/or data packets and/or (start) bit durations and/or time intervals between specific bits and/or a duration of a data packet and/or time intervals between successive data packets and/or time durations of specific synchronization bit patterns, etc., which are received by the power unit on its power unit interface from the control unit in order to adjust the power unit clock pulse.

The power unit furthermore has a power unit processor which is designed to control the power semiconductors, if necessary via power semiconductor drivers, depending on the control parameter and the power unit clock pulse.

The power unit furthermore has at least one sensor unit which is designed to determine the at least one actual value.

The control unit is designed to transmit the at least one control parameter via the control unit interface to the power unit.

The power unit is designed to transmit the at least one actual value via the power unit interface to the control unit.

BRIEF DESCRIPTION OF THE DRAWINGS

The invention is described in detail below with reference to the drawings, in which.

DETAILED DESCRIPTION OF THE PREFERRED EMBODIMENTS

Figure 1:
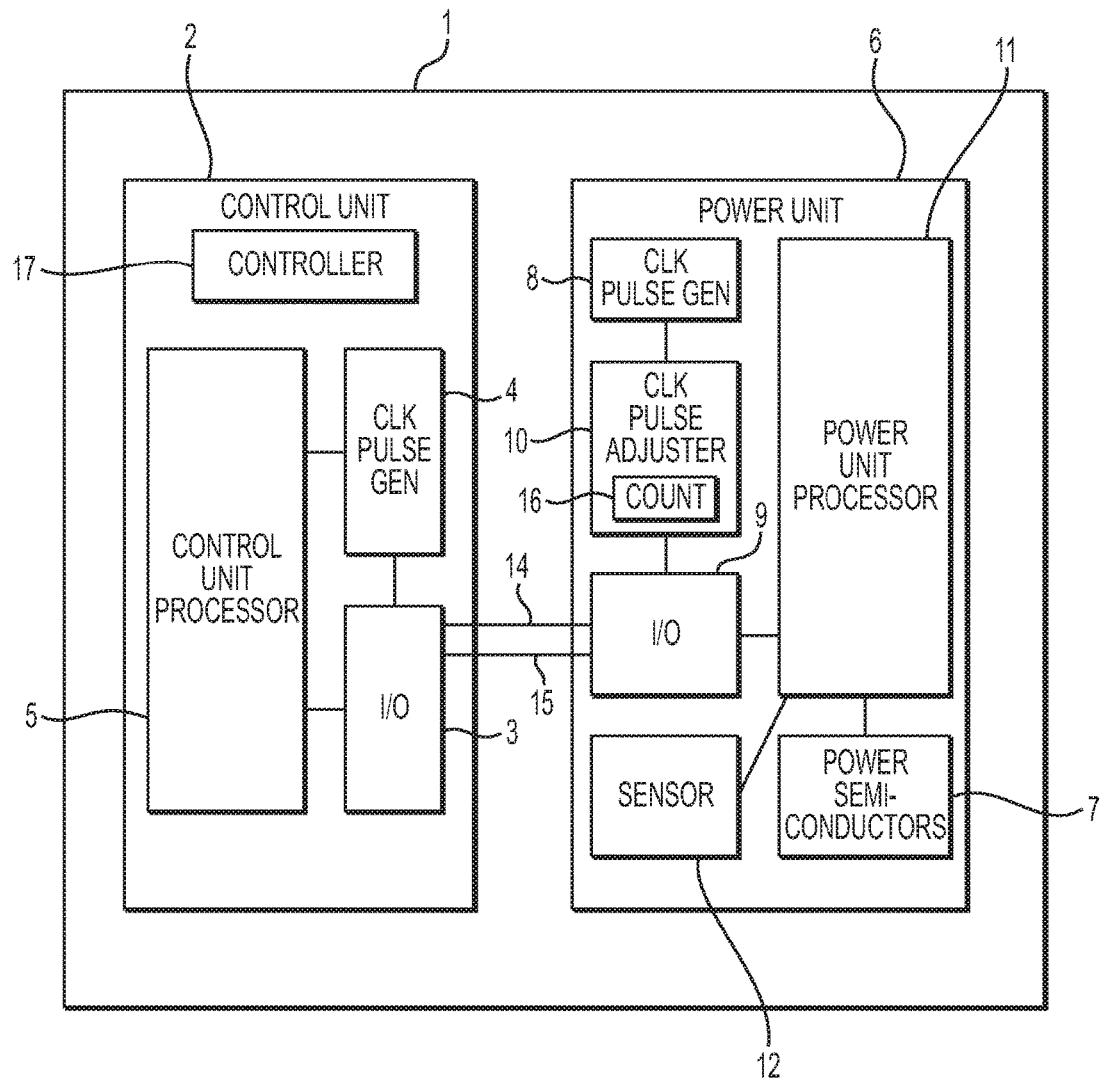
FIG. 1 shows schematically a frequency converter according to the invention.

FIG. 1 shows a frequency converter 1 with a control unit 2 which is disposed in a control unit housing (not shown in detail).

The control unit 2 has a serial 2-wire UART control unit interface 3.

The control unit 2 furthermore has a control unit clock pulse generator 4 in the form of a quartz oscillator to generate a control unit clock pulse. Data are transmitted via the control unit interface 3 in terms of their timing depending on the control unit clock pulse.

The control unit 2 furthermore has a control unit microprocessor 5 which is designed to calculate at least one control parameter depending on at least one actual value.

The frequency converter 1 furthermore has a power unit 6 which is disposed in a power unit housing and has a serial data connection to the control unit 2.

The power unit 6 has a number, for example six, of power semiconductors 7.

The power unit 6 furthermore has a power unit clock pulse generator 8 in the form of a DCO for generating an adjustable power unit clock pulse.

The power unit 6 furthermore has a serial 2-wire UART power unit interface 9 which is operatively connected to the control unit interface 3 to set up a data connection. The control unit interface 3 and the power unit interface 9 form an electrically isolating 2-line interface, wherein, in relation to the control unit 2, data are transmitted on a first line 14 of the two lines 14, 15 and data are received on a second line 15 of the two lines 14, 15. No specific sync channel is provided between the control unit 2 and the power unit 6.

Figure 2:
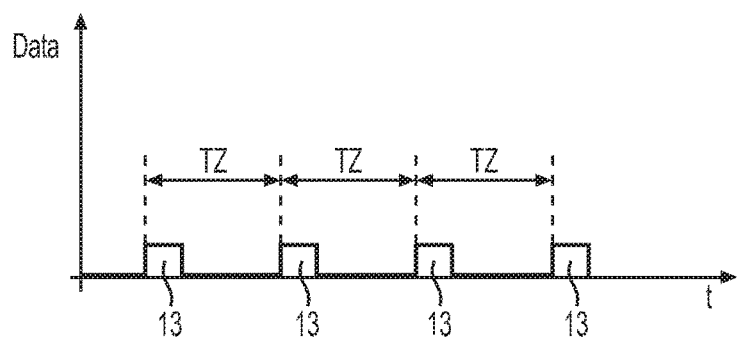
FIG. 2 shows schematically a variation with time of data packets which are transmitted from a control unit of the frequency converter shown in FIG. 1 to a power unit of the frequency converter shown in FIG. 1.

The power unit 6 furthermore has a clock pulse generator adjustment unit 10 which has a signal connection to the power unit interface 6 and is designed to adjust the power unit clock pulse depending on a cycle time TZ (see FIG. 2) with which data packets 13 are transmitted from the control unit 2 to the power unit 6.

The power unit 6 furthermore has a power unit microprocessor 11 which is designed to control the power semiconductors 7 depending on the control parameter and the power unit clock pulse.

The power unit 6 furthermore has at least one sensor unit 12 which is designed to determine the at least one actual value, here, for example, a motor current.

The control unit 2 is designed to transmit the at least one control parameter via the control unit interface 3 to the power unit 6, and the power unit 6 is designed to transmit the at least one actual value via the power unit interface 9 to the control unit 2.

The clock pulse generator adjustment unit 10 has a counter unit 16 in the form of a capture/compare unit which is clocked depending on the power unit clock pulse, wherein the clock pulse generator adjustment unit 10 or its capture/compare unit is designed to read and temporarily store an associated counter status on reception of a falling edge of a start bit of a respective data packet 13, to calculate a difference between counter statuses belonging to successive data packets, and to adjust the power unit clock pulse depending on the difference between the counter statuses. For this purpose, the difference is compared with a reference value, wherein, if the difference is greater than the reference value, the power unit clock pulse is reduced by an amount which is dependent on a difference between the reference value and the counter status difference. If the difference is less than the reference value, the power unit clock pulse is increased by an amount which is dependent on the difference between the reference value and the counter status difference.

This synchronization of the power unit clock pulse depending on the cycle time TZ and therefore depending on the control unit clock pulse can be performed once only, for example in an initialization routine. Alternatively, the synchronization can also be performed cyclically at specific time intervals, for example with each reception of a data packet 13. Again alternatively, the power unit clock pulse can first be synchronized with the control unit clock pulse, as described above, in the initialization routine. Thereafter, only one counter value of the capture/compare unit can be determined on the edge of the start bit of a respective data packet, wherein the counter value determined in this way is monitored in order to determine whether it corresponds to a reference value. If, for example, a counter overflow occurs precisely once every cycle time TZ of the data packets 13 when the power unit clock pulse and control unit clock pulse are synchronized, the determined counter value remains constant. If the counter value then changes, this indicates that the power unit clock pulse is drifting in relation to the control unit clock pulse, so that the power unit clock pulse must be synchronized by means of the clock pulse generator adjustment unit 10.

The frequency converter 1 is designed to implement a closed motor current control loop, wherein a controller 17 of the control loop for calculating the control parameter is disposed in the control unit 2, an adjustment device of the control loop is disposed in the power unit 6, and the sensor unit 12 forms a measuring device of the control loop.

The control unit 2 is designed to perform repeated control unit processes synchronously with the transmitted data packets 13. The power unit 6 is designed accordingly to perform repeated power unit processes synchronously with the received data packets 13.

For example, the control unit 2 can transmit the instantaneous control parameter in a respective data packet 13 to the power unit 6, and the power unit 6 can transmit the actual value(s) to the control unit 2 at a predefined time interval in relation to the start bit of a respective data packet 13.

The control unit 2 can furthermore execute a control algorithm on the basis of the received actual value(s), and the power unit 6 can set a pulse duty factor of a pulse width modulation on the basis of the control parameter. Here, the control parameter may, for example, be a reference pulse duty factor of a pulse width modulation and one of the actual values may be a motor current. Further, in particular cascaded, control loops can obviously be provided, as is customary in the case of frequency converters.

The power unit clock pulse generator 8, the serial power unit interface 9, the clock pulse generator adjustment unit 10, the power unit processor 11 and, where relevant, the sensor unit 12 or parts thereof can be integrated on a single microcontroller.

The control unit 2 may be designed to transmit one or more data packets 13, for example having a start bit, one or more data bits and a stop bit, with a predefined duration and/or with a predefined time interval between one another via the control unit interface 3, wherein the duration and/or the time interval is/are dependent on the control unit clock pulse. The clock pulse generator adjustment unit 10 may be designed to adjust the power unit clock pulse depending on the predefined duration and/or the predefined time interval. For this purpose, the clock pulse generator adjustment unit 10 may have a counter unit 16 which is clocked depending on the power unit clock pulse, wherein the clock pulse generator adjustment unit 10 may be designed to define an associated counter status on reception of a start bit of a respective data packet, to define an associated counter status on reception of a stop bit of a respective data packet, to calculate a difference between a respective start bit counter status and a respective stop bit counter status and to adjust the power unit clock pulse depending on the difference between the counter statuses.

The control unit 2 may be designed to transmit data packets 13, for example having a start bit, one or more data bits representing, for example, the control parameter, and a stop bit, for a defined time duration or constantly, periodically with a predefinable or predefined cycle time via the control unit interface 3 to the power unit 6. The cycle time may, for example, be in the μs range and may preferably be 125 μs. The clock pulse generator adjustment unit 10 may be designed to adjust the power unit clock pulse depending on the cycle time. The cycle time predefined by means of the control unit 2 is dependent on the control unit clock pulse. The cycle time can therefore be used in the power unit 6 to adapt the power unit clock pulse to the control unit clock pulse so that no high-precision power unit clock pulse generator 8 needs to be provided in the power unit 6. The control unit clock pulse generator 4 acts here as a clock pulse master and the power unit clock pulse generator 8, in conjunction with the clock pulse generator adjustment unit 10, acts as a clock pulse slave.

The clock pulse generator adjustment unit 10 may have a counter unit 16, for example in the form of a capture-compare unit, which is clocked, i.e. incremented or decremented, depending on the power unit clock pulse. The clock pulse generator adjustment unit 10 may be designed to define and temporarily store an associated counter status of the counter unit 16 on reception of a respective data packet or in the event of a (rising or falling) edge of a start bit of a respective data packet 13, to calculate a difference between counter statuses belonging to temporally successive data packets and to adjust the power unit clock pulse depending on the difference between the counter statuses. The difference between the counter statuses may, for example, be compared with an expected reference value. If the difference is greater than the reference value, it can be inferred that the power unit clock pulse is too high in relation to the control unit clock pulse, so that the clock pulse generator adjustment unit 10 reduces the power unit clock pulse. If the difference is less than the reference value, it can be inferred that the power unit clock pulse is too low in relation to the control unit clock pulse, so that the clock pulse generator adjustment unit 10 increases the power unit clock pulse.

The control unit 2 may be designed to perform control unit processes which are performed by means of the control unit processor 5 and which are periodically repeated, for example current-regulating processes, synchronously with the transmitted data packets, in particular synchronously with a (rising or falling) edge of a start bit of the transmitted data packets. The power unit 6 may be designed to perform power unit processes which are performed by means of the power unit processor 11, which are periodically repeated and which correspond to the control unit processes, synchronously with the received data packets, in particular synchronously with the (rising or falling) edge of the start bit of the received data packets. In this way, processes between the control unit 2 and the power unit 6 can be synchronized with one another without synchronization signals and synchronization lines intended specifically for this purpose having to be provided.

The clock pulse generator adjustment unit 10 may be designed to define an associated counter status of the counter unit 16 as a local timestamp on reception of a respective data packet and to change the power unit clock pulse on the basis of a difference between the defined counter status and a predefined phase reference value, which can be stored in the power unit 6, until the power unit operates synchronously with the control unit with a phase relationship which is dependent on the phase reference value. The clock pulse generator adjustment unit 10 can use the power unit clock pulse as an adjustment parameter of a phase-locked loop (PLL), wherein the power unit clock pulse is changed until the desired phase relationship which is dependent on the phase reference value has been set.

The frequency converter 1 may be designed to implement a closed control loop. The closed control loop may, for example, be a current control loop to control a motor current, a torque control loop to control a motor torque, a vector control loop of a vector control, etc. A controller 17 or control element of the control loop for calculating the control parameter is disposed in the control unit. An adjustment device 20 of the control loop is disposed in the power unit 6, wherein the controller and associated adjustment device have a data connection via the serial interfaces. The adjustment device 20 is conventionally designed to generate a physical adjustment parameter. The adjustment parameter may, for example, be a pulse-width-modulated signal, wherein a pulse duty factor of the pulse-width-modulated signal is predefined by the control unit 2 as a control parameter. The sensor unit 12 may be a measurement device for determining the actual value of the control loop. Due to the division according to the invention of the control loop between the control unit 2 and the power unit 6, it is possible to design the power unit very simply, since the power unit performs only simple and generic tasks, for example the adjustment parameter generation and the actual value recording. The power unit 6 can therefore ideally be manufactured in variant-free form and can be stored in a warehouse. Specific control tasks are then implemented by means of specific variants of the control unit 2.

The control parameter(s) may be: reference motor currents, reference motor voltages, a reference motor torque and a reference pulse duty factor of the pulse width modulation which is conventionally generated by means of the power semiconductors.

The actual value(s) may be: motor currents, motor voltages, rotation angle settings, an intermediate loop voltage and a temperature.

The control unit interface 3 and the power unit interface 9 may form or be/represent an electrically isolating 2-line interface 14,15, wherein, from the perspective of the control unit, data are exclusively transmitted on a first line of the two lines and data are exclusively received on a second line of the two lines.

The control unit interface 3 and the power unit interface 9 may in each case be Universal Asynchronous Receiver Transmitter (UART) interfaces.

A phase-locked synchronization of the power unit processor (slave) 11 having no precise time reference with the control unit processor (master) 5 having an exact time reference can be effected by means of the invention. The phase between the master and slave can be randomly specified. As a result, the data exchange and the processing of the data can be synchronized in such a way as to produce a constant, minimum control dead time for the frequency converter. According to the invention, the synchronization with an external reference signal (e.g. fieldbus clock pulse) can similarly be easily implemented.

The two processors are connected via a serial UART interface, wherein the UART interface has precisely one TX connection and precisely one RX connection. The synchronization of the slave is implemented, for example, using the first edge of the data packet of the master. A clock pulse reference or time reference is provided in the control unit 2. An adjustable oscillator 8, which is synchronized with the time reference, is provided in the slave. The adjustable oscillator may be a DCO (Digitally Controlled Oscillator).

The power unit 6 has a processor 11 without a precise time reference. The processor of the power unit is kept synchronous with the processor 5 of the control unit 2 with an exact time reference (quartz and optionally fieldbus synchronization). The power unit 6 and control unit 2 may be electrically isolated from one another.

Material costs can be reduced by means of the invention. A merely two-channel signal coupler can be used instead of a three-channel, electrically isolating signal coupler, which, along with Tx and Rx connections, must also have a sync connection. As a result, the number of pins can be reduced in systems with plug-in connectors between the power unit and control unit. The number of required protective components (e.g. ESD protection) can be reduced due to the reduced number of required lines. The frequency converter furthermore requires only one exact time reference (quartz oscillator). The slave processor or power unit processor requires no exact time reference, i.e. an external quartz oscillator can be dispensed with, so that a processor with fewer pins can be used. Furthermore, no separate synchronization channel is necessary, as a result of which a processor with fewer pins can similarly be used. Since the slave is coupled to the master in a phase-locked manner, the data processing and the exchange of data can be substantially simplified. Additional synchronization mechanisms and the software can be dispensed with.

Since a possibly present external synchronization source (fieldbus, digital input, etc.) is evaluated by the control unit 2, the control unit 2 can similarly synchronize the power unit processor 11 with the external synchronization source through generation of the data packets that is temporally adapted to the external synchronization source, i.e. is synchronous, so that synchronized drive systems can be easily implemented.

The invention claimed is:

1. A frequency converter, comprising:
a control circuit, including:
a serial control interface,
a clock pulse generator configured to generate a clock pulse, wherein data are transmitted via the serial control interface depending on the clock pulse, and
a control processor configured to define at least one control parameter depending on at least one actual value; and
a power circuit which is in data connection to the control circuit, the power circuit including:
a number of power semiconductors,
a power clock pulse generator configured to generate an adjustable power clock pulse,
a serial power interface which is connectable to the serial control interface in order to set up the data connection,
a clock pulse adjustment circuit which is in signal connection to the serial power interface and configured to adjust the adjustable power clock pulse depending on signals which are received by the serial power interface of the power circuit,
a power processor configured to control the number of power semiconductors depending on the at least one control parameter and the adjustable power clock pulse, and
at least one sensor configured to determine the at least one actual value,
wherein the control circuit is configured to transmit the at least one control parameter via the serial control interface to the power circuit, and
wherein the power circuit is configured to transmit the at least one actual value via the serial power interface to the control circuit.

2. The frequency converter as claimed in claim 1, wherein:
the control circuit is further configured to transmit data packets with a predefined duration and/or with a predefined time interval between one another via the serial control interface, and
the clock pulse adjustment circuit is configured to adjust the adjustable power clock pulse depending on the predefined duration and/or the predefined time interval.

3. The frequency converter as claimed in claim 2, wherein:
the control circuit is configured to perform repeated control circuit processes synchronously with the transmitted data packets, and
the power circuit is configured to perform repeated power circuit processes synchronously with data packets received from the control circuit.

4. The frequency converter as claimed in claim 3, wherein:
the clock pulse adjustment circuit is configured to define an associated counter status as a local timestamp on reception of a respective data packet and to adapt the adjustable power clock pulse on the basis of a difference between the defined associated counter status and a predetermined phase reference value in such a way that the power circuit operates synchronously with the control circuit with a phase relationship which is dependent on the predetermined phase reference value.

5. The frequency converter as claimed in claim 1, wherein
the control circuit is further configured to transmit data packets periodically with a predetermined cycle time via the serial control interface, and
the clock pulse adjustment circuit is configured to adjust the adjustable power clock pulse depending on the predetermined cycle time.

6. The frequency converter as claimed in claim 5, wherein:
the clock pulse adjustment circuit comprises a counter circuit which is clocked depending on the adjustable power clock pulse, wherein the clock pulse adjustment circuit is further configured to define an associated counter status on reception of a respective data packet, to calculate a difference between counter statuses belonging to successive data packets and to adjust the adjustable power clock pulse depending on the difference between the counter statuses.

7. The frequency converter as claimed in claim 5, wherein:
the control circuit is configured to perform repeated control circuit processes synchronously with the transmitted data packets, and
the power circuit is configured to perform repeated power circuit processes synchronously with data packets received from the control circuit.

8. The frequency converter as claimed in claim 6, wherein:
the control circuit is configured to perform repeated control circuit processes synchronously with the transmitted data packets, and
the power circuit is configured to perform repeated power circuit processes synchronously with data packets received from the control circuit.

9. The frequency converter as claimed in claim 6, wherein:
the clock pulse adjustment circuit is configured to define the associated counter status as a local timestamp on reception of the respective data packet and to adapt the adjustable power clock pulse on the basis of a difference between the defined associated counter status and a predetermined phase reference value in such a way that the power circuit operates synchronously with the control circuit with a phase relationship which is dependent on the predetermined phase reference value.

10. The frequency converter as claimed in claim 1, wherein
the frequency converter is configured to implement a control loop, wherein
a controller of the control loop for calculating the at least one control parameter is disposed in the control circuit,
the power circuit forms an adjustment device of the control loop, and
the at least one sensor forms a measuring device of the control loop.

11. The frequency converter as claimed in claim 10, wherein the control loop is a current control loop.

12. The frequency converter as claimed in claim 1, wherein:
the at least one control parameter is selected from a group having the following control parameters:
reference motor currents,
reference motor voltages,
a reference motor torque, and
a reference pulse duty factor of a pulse width modulation.

13. The frequency converter as claimed in claim 12, wherein:
the at least one actual value is selected from a group having the following actual values:
motor currents,
motor voltages,
rotation angle settings of a rotor shaft,
an intermediate loop voltage, and
a temperature.

14. The frequency converter as claimed in claim 1, wherein:
the at least one actual value is selected from a group having the following actual values:
motor currents,
motor voltages,
rotation angle settings of a rotor shaft,
an intermediate loop voltage, and
a temperature.

15. The frequency converter as claimed in claim 1, wherein:
the serial control interface and the serial power interface form an electrically isolating 2-line interface, wherein, in relation to the control circuit, data are transmitted on a first line of two lines and data are received on a second line of the two lines.

16. The frequency converter as claimed in claim 1, wherein:
the serial control interface and the serial power interface are Universal Asynchronous Receiver Transmitter (UART) interfaces.

\* \* \* \* \*